United States Patent
Liou et al.

(10) Patent No.: US 6,320,254 B1
(45) Date of Patent: *Nov. 20, 2001

(54) PLUG STRUCTURE

(75) Inventors: Fu-Tai Liou; Andy Chuang, both of Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,773

(22) Filed: Apr. 8, 1999

(51) Int. Cl.[7] .......................... H01L 23/48; H01L 23/52; H01L 29/40
(52) U.S. Cl. .......................... 257/688; 257/181; 257/772; 257/780; 257/773; 257/774
(58) Field of Search ................... 257/772, 785, 257/181, 688, 780, 773, 774; 438/117, 613; 228/180.22

(56) References Cited

U.S. PATENT DOCUMENTS

| | | | |
|---|---|---|---|
| 5,457,879 | * | 10/1995 | Gurtler et al. ........................ 28/895 |
| 5,889,326 | * | 3/1999 | Tanaka ................................ 257/737 |
| 6,028,357 | * | 2/2000 | Moriyama ........................... 257/737 |
| 6,031,293 | * | 2/2000 | Hsuan et al. ........................ 257/786 |
| 6,087,597 | * | 7/2000 | Shimada et al. .................... 438/613 |

FOREIGN PATENT DOCUMENTS 6-15155 * 5/1994 (JP).

* cited by examiner

Primary Examiner—Jhihan B Clark

(57) ABSTRACT

A plug structure capable of directly coupling to a package-less bonding pad without having to go through a third conductive medium. The plug structure includes several plugs on a base substrate, such as a printed circuit board or a carrier. A solder is disposed on the plug surface in which the plug can be a cylinder or mushroom-like shape and the solder can be a film or a ball.

11 Claims, 3 Drawing Sheets

PLUG STRUCTURE

BACKGROUND OF THE INVENTION

1. Field of the Invention

The invention relates to a plug structure disposed on a base substrate, and more particularly to a plug structure adapted for a packageless bonding pad structure.

2. Description of the Related Art

After years of development, semiconductor devices are now used almost everywhere. However, integrated circuit (IC) chips fabricated in a semiconductor manufacturing plant are practically useless unless they are properly packaged. The IC chip must first be mounted on a suitable carrier, and then the carrier itself must be enclosed by a protective casing before the IC chip can be inserted inside electrical equipment. In general, the packaging process can be roughly divided into three stages:

1. A proper carrier must be selected for holding the silicon chip. Different types of carriers are available including lead frame, film carrier and printed circuit board (PCB). Normally, the use of a film carrier requires tape auotmatic bonding (TAB).

2. The silicon chip must be electrically connected to the carrier. At present, the techniques for connecting silicon chip and the carrier include wire bonding, tape automatic bonding and flip chip or controlled collapse chip connection.

3. The silicon chip and the carrier including their junciton areas must be enclosed by epoxy resin, ceramics or other packaging material, thereby forming a rigid body for protecting the IC chip and its connecting elements.

However, before the contact points on an IC chip can be used to couple electrically with the carrier, a special structure for electrical connection such as a bonding pad or a bump must first be created at those contact points. Moreover, the establishment of a proper electrical connection between the bonding pads or bumps on the silicon chip with the carrier must be carried out in special processing stations. FIG. 1 is a schematic cross-sectional side view showing a conventional wire connection between a bonding pad on a silicon chip and a lead frame pin using wire-bonding techniques. First, a metallic bonding pad 12 is formed on a silicon chip 10. Thereafter, the silicon chip and its surrounding lead frame are placed inside a specified wire-bonding machine. Next, the wire-bonding machine binds one end of a short piece of conductive wire 14 to the bonding pad 12, and then binds the other end of the wire 14 to the lead frame pin 16. In general, the conductive wires 14 can be gold, aluminum or copper wires.

FIG. 2 is a schematic cross-sectional side view showing conventional electrical connection between a bonding pad on a silicon chip and tape carrier using tape automatic bonding techniques. The method includes forming a bump 20 either on top of a bonding pad 12 or on the inner lead 18 of a film carrier. Next, an inner lead bonding (ILB) operation is carried out to join the bonding pad 12 and a portion of the inner lead 18 together. Thereafter, an outer lead bonding (OLB) operation is carried out to join the outer lead with the electrode on a substrate plate using soldering, anisotropic conductive film (ACF) or photoharden insulation resin.

FIG. 3 is a schematic cross-sectional side view showing conventional electrical connection between a bonding pad on a silicon chip and a package medium using flip-chip techniques. Similarly, the flip-chip method involves the formation of a bump 22 on a bonding pad 12. A special machine must be used for aligning the bump 22 with the electrode 26 on a base substrate 24 and exerting a proper amount of pressure on the silicon chip. Finally, heating and underfilling operations have to be carried out by the machine.

However, in all three illustrations above, special processing operations using special processing stations have to be carried out just to link up the bonding pads. Hence, additional processing time and production cost is incurred.

SUMMARY OF THE INVENTION

Therefore, the invention is directed towards to provision of a plug structure capable of directly coupling to packageless bonding pad without having to go through a third conductive medium. The plug structure includes several plugs on a base substrate. Solder is disposed on the plug surface in which the plug can be a cylinder or mushroom-like shape and the solder can be a film or ball.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a futher understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
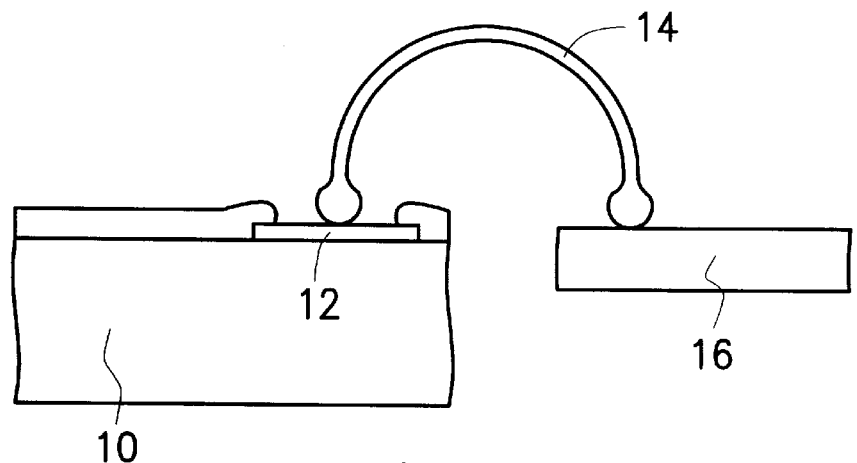
FIG. 1 is a schematic cross-sectional side view showing conventional wire connection between a bonding pad on a silicon chip and a lead frame pin using wire-bonding techniques.
Figure 2:
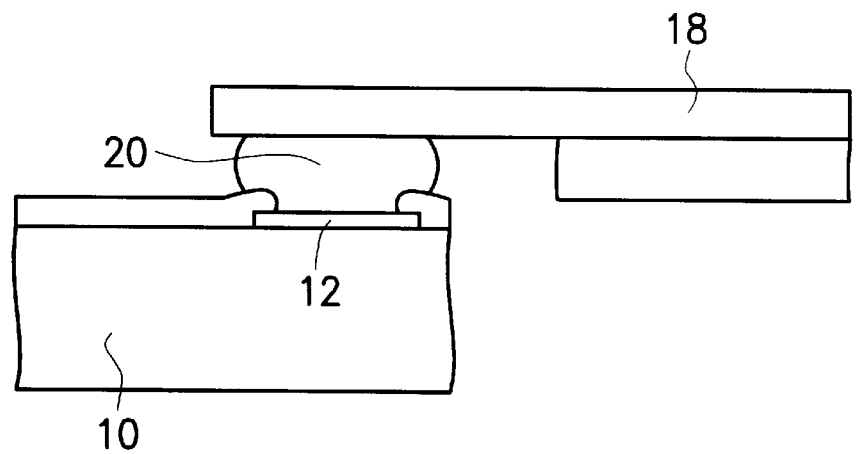
FIG. 2 is a schematic cross-sectional side view showing conventional electrical connection between a bonding pad on a silicon chip and tape carrier using tape automatic bonding techniques.
Figure 3:
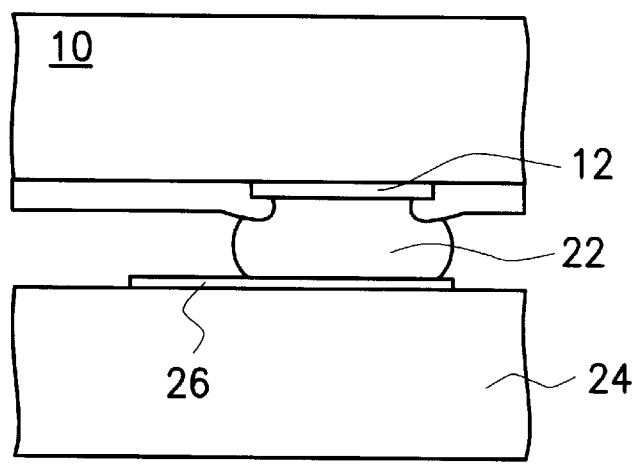
FIG. 3 is a schematic cross-sectional side view showing conventional electrical connection between a bonding pad on a silicon chip and a package medium using flip-chip techniques.

Reference will now be made in detail to the present preferred embodiments of the invention, examples of which are illustrated in the accompanying drawings. Wherever possible, the same reference numbers are used in the drawings and the description to refer to the same or like parts.

Figure 4:
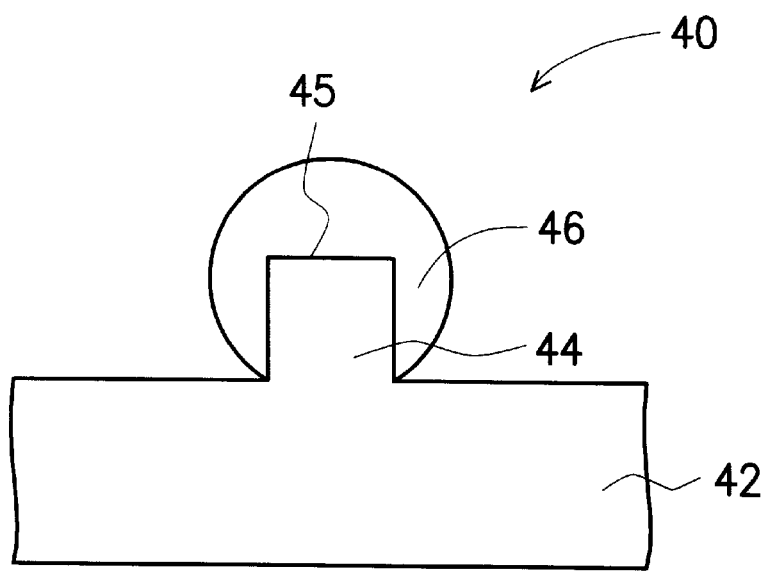
FIG. 4 is a schematic cross-sectional view illustrating a plug structure in a preferred embodiment according to the invention.

FIG. 4 is a schematic cross-sectional view showing a plug structure in a preferred embodiment according to the invention. The plug structure 40 in this invention can be disposed on a base substrate 42, such as a carrier or a printed circuit board. The plug structure 40 further includes a plug 44 and a solder 46. The plug 44 is formed on the base substrate 42 and the solder 46 is then formed on a surface 45 of the plug 44, as illustrated in FIG. 4, and can be, for example, a circle, an awl, a cylinder or a rectangle in shape. The solder 46 is made of tin or tin alloy and can be shaped as a ball, as seen in FIG. 4. The formation of the ball utilizes the solder disposed on plug 44 followed by reflow, so that the solder 46 can be formed as a ball due to the coherence between molecules in the solder 46. However, the solder 46 on the plug 44 is not restricted to ball shape; it also can be a film coated on the plug 44.

Figure 5:
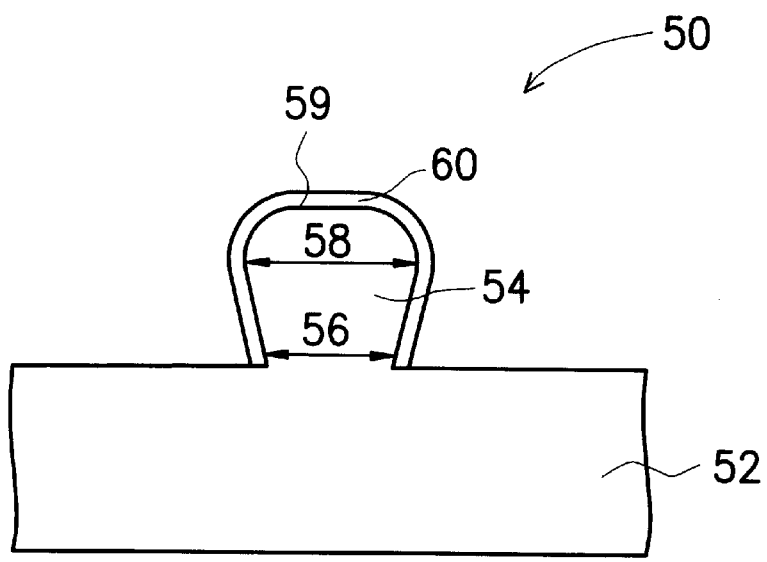
FIG. 5 is a schematic cross-sectional view illustrating a plug structure in a preferred embodiment according to the invention.

In addition, the plug structure 50 in this invention can be manufactured as a mushroom-like or awl shape, as seen in FIG. 5. The width 58 increases as it approaches an upper surface 59 of the plug 54 and decreases as it approaches the base substrate 52 (labeled 56 in FIG. 5). The solder 60 on the plug 54 can be a film or ball, for example, and is made of tin or tin alloy.

Figure 6:
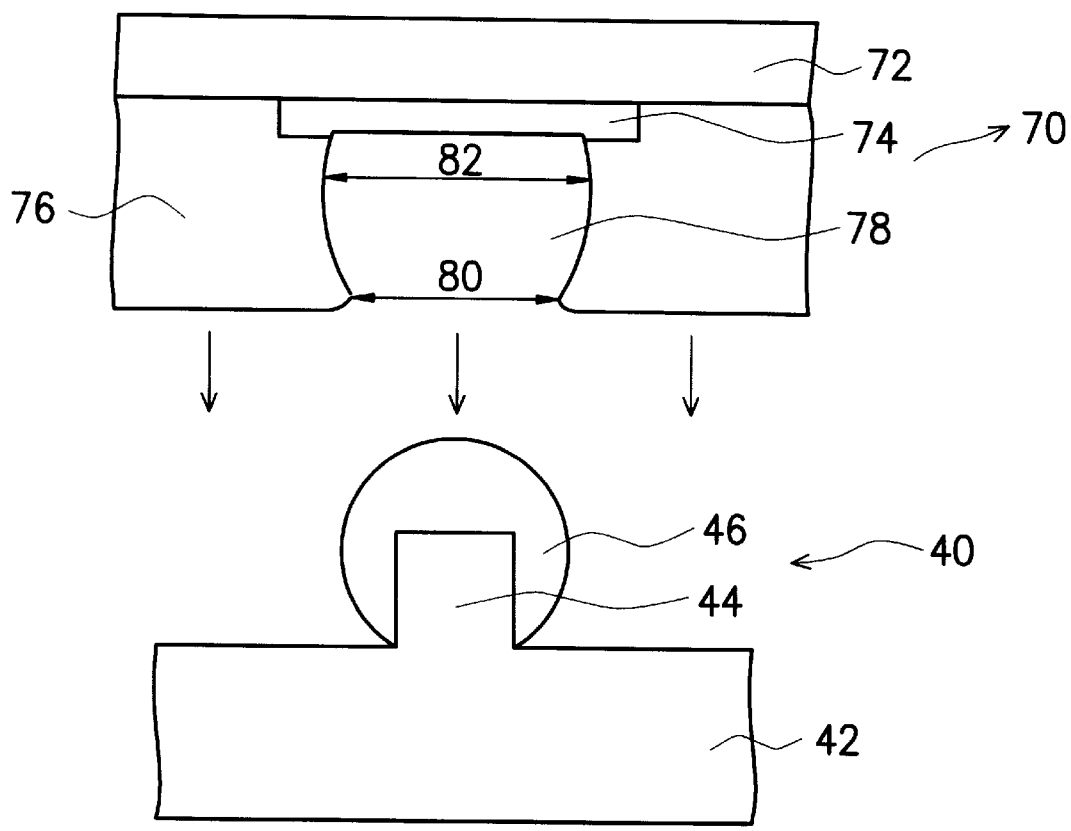
FIG. 6 is schematic cross-sectional view illustrating a plug structure electrically connected to a packageless bonding pad in a preferred embodiment according to the invention.

The plug structure as mentioned above can be jointed with a packageless bonding pad structure. FIG. 6 shows a joint of the plug structure in this invention and a packageless bonding pad structure. The packageless bonding pad structure 70 is disposed on a chip 72 having a metallic pad 74 formed thereon. A passivation layer 76 has an open cavity 78 to expose most of the metallic pad 74. The passivation layer 76 has a thickness such that the open cavity 78 above the metal pad 74 is shaped into a centrally bulging female socket. In other words, diameter of the open cavity 78 decreases on approaching the upper surface of the passivation layer 76 (labelled 80 in FIG. 6) and increases on approaching the metal pad 34 surface (labelled 42 in FIG. 6). The plug structure illustrated in FIG. 4 is used as an example to illustrate how a plug joins with the packageless bond pad structure 70. The advantage of forming the open cavity 78 into this shape is that a base substrate 42 having connection plugs 44 shaped into a cylinder or a mushroom-like protrusion 46 can snap into the socket cavity 78. Accordingly, the smaller diameter 80 of the open cavity 78 is joined with the wider width of the plug structure 40. The snapped-together structure is shown in FIG. 7 and the solder 46 at least physically contacts the metallic bond 74.

Figure 7:
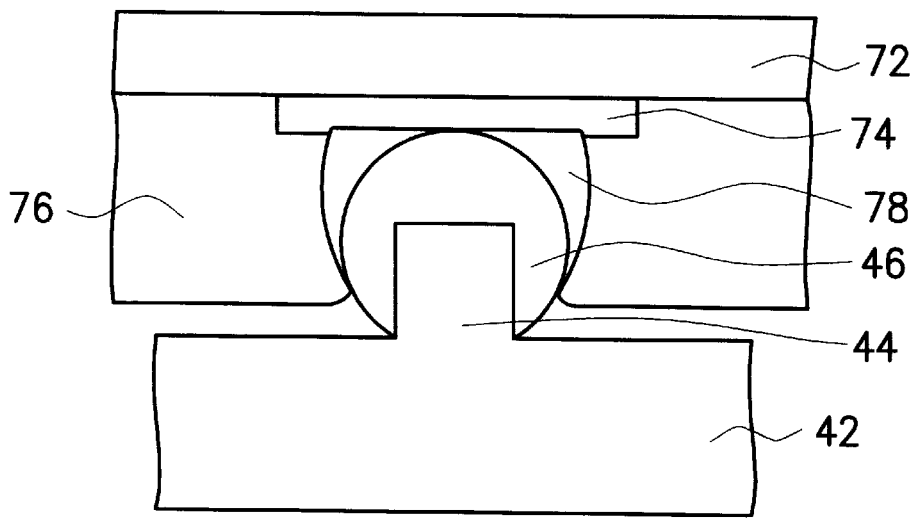
FIG. 7 is a schematic cross-sectional view illustrating a structure after a plug structure is electrically connected to a packageless bonding pad in a preferred embodiment according to the invention.

Referring to FIG. 7, the widest width of the solder 46 is larger than the smallest diameter of the female socket (the open cavity 80) after these two structures are snapped together; hence the packageless structure 70 has a good joint with the plug structure 40. In order to ensure electrical coupling between the solder 46 on the base substrate 42 and the metallic pad 74, a thermal treatment is performed after the structures are snapped together to allow the solder 46 to uniformly contact the metallic pad 74. The temperature of the thermal treatment is lower than 400° C., and preferably about 200–300° C.

Therefore, the plug structure in this invention formed on a printed ciruit board or a carrier snaps into the female socket of the metallic bond on a chip by the application of a small pressure. By using the solder on the plug, the bond pad can be coupled with the plug without using a third medium. Since sophisticated soldering operations for coupling the silicon chip to a carrier or a printed circuit board are unnecessary, special processing stations do not need to be purchased and production cost will be lowered.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A interconnect structure suitable for a base substrate, comprising:

at least a plug on the base substrate wherein the plug is covered by a solder, and a chip on which a passivation layer having at least an opening cavity for exposing an external connection underlying the passivation layer is provided, wherein the passivation layer has a thickness to shape the opening cavity such that the plug having the solder thereon is snapped into the opening cavity for electrically contact with the exposed external connection.

2. The structure according to claim 1, wherein the base substrate is selected from a printed board and a carrier.

3. The structure according to claim 1, wherein a plug shape is selected from a group consisting of a cylinder and rectangle.

4. The structure according to claim 1, wherein the solder is selected from a group of materials consisting of tin and tin alloy.

5. The structure according to claim 1, wherein a solder shape includes a ball disposed on each plug.

6. A interconnect structure suitable for a base substrate, comprising:

at least a plug on the base substrate, wherein the plug is covered by a solder wherein a width increases on approaching an upper surface of the plugs and decreases on approaching the base substrate, wherein the plug is snapped onto a packageless bond pad; and a chip on which a passivation layer having at least an opening cavity for exposing an external connection underlying the passivation layer is provided, Wherein the passivation layer has a thickness to shape the opening caity such that the plug having the solder thereon is snapped into the opeing cavity for electrically contact with the exposed external connection, and Wherein the solder fits the opening cavity after thermal treatment.

7. The structure according to claim 6, wherein the base substrate is selected from a printed board and a carrier.

8. The structure according to claim 6, wherein the plug is shaped as awl.

9. The structure according to claim 6, wherein the solder is selected from a group of materials consisting of tin and tin alloy.

10. The structure according to claim 6, wherein the solder includes a ball disposed on each plug.

11. The structure according to claim 6, wherein a solder shape includes a film disposed on each plug.

* * * * *